(12) United States Patent
Mu

(10) Patent No.: US 12,538,769 B2
(45) Date of Patent: Jan. 27, 2026

(54) METHOD FOR MANUFACTURING CONDUCTIVE PILLAR STRUCTURE FOR SEMICONDUCTOR SUBSTRATE AND CONDUCTIVE PILLAR STRUCTURE FOR SEMICONDUCTOR SUBSTRATE

(71) Applicant: CHANGXIN MEMORY TECHNOLOGIES, INC., Hefei (CN)

(72) Inventor: Kejun Mu, Hefei (CN)

(73) Assignee: CHANGXIN MEMORY TECHNOLOGY, INC., Hefei (CN)

( * ) Notice: Subject to any disclaimer, the term of this patent is extended or adjusted under 35 U.S.C. 154(b) by 518 days.

(21) Appl. No.: 17/807,794

(22) Filed: Jun. 20, 2022

(65) Prior Publication Data

US 2023/0018338 A1 Jan. 19, 2023

Related U.S. Application Data

(63) Continuation of application No. PCT/CN2021/124053, filed on Oct. 15, 2021.

(30) Foreign Application Priority Data

Jul. 19, 2021 (CN) .......................... 202110815094.8

(51) Int. Cl.
 *H01L 21/762* (2006.01)
 *H01L 21/465* (2006.01)
(52) U.S. Cl.
 CPC ...... *H01L 21/76208* (2013.01); *H01L 21/465* (2013.01); *H01L 21/76224* (2013.01)
(58) Field of Classification Search
 CPC ............. H01L 21/76208; H01L 21/465; H01L 21/76224
 See application file for complete search history.

(56) References Cited

U.S. PATENT DOCUMENTS 6,350,642 B1  2/2002  Lee
8,247,304 B2  8/2012  Youn
(Continued)

FOREIGN PATENT DOCUMENTS

CN  107946237 A  4/2018
CN  110875319 A  3/2020
CN  110890345 A  3/2020

OTHER PUBLICATIONS

Extended European Search Report in application No. 21950753, mailed on Jun. 25, 2024.

(Continued)

*Primary Examiner* — Norman D Richards
(74) *Attorney, Agent, or Firm* — Syncoda LLC; Feng Ma

(57) ABSTRACT

A method for manufacturing a semiconductor structure includes the following operations. A base and a dielectric layer arranged on the base are provided. A first conductive pillar, a second conductive pillar and a third conductive pillar arranged in the dielectric layer are formed. A mask layer is formed. A portion of a thickness of the third conductive pillar is etched by using the third mask layer as a mask to form a third lower conductive pillar and a third upper conductive pillar stacked on one another, in which the third upper conductive pillar, the third lower conductive pillar and the dielectric layer are configured to form at least one groove. A cover layer filling the at least one groove is formed, in which the cover layer exposes the top surface of the third upper conductive pillar.

9 Claims, 6 Drawing Sheets

(56) References Cited

U.S. PATENT DOCUMENTS

| | | | |
|---|---|---|---|
| 9,484,296 | B2 | 11/2016 | Takahashi |
| 9,515,085 | B2 | 12/2016 | Rabkin |
| 10,163,688 | B2 | 12/2018 | Chen |
| 10,354,956 | B1 | 7/2019 | Yu |
| 10,535,660 | B1 | 1/2020 | Chuang |
| 10,535,669 | B2 | 1/2020 | Wang |
| 10,741,417 | B2 | 8/2020 | Tien |
| 10,770,468 | B2 | 9/2020 | Wang |
| 10,937,732 | B2 | 3/2021 | Yang |
| 11,476,365 | B2 * | 10/2022 | Chu .................. H01L 23/53242 |
| 2005/0142756 | A1 * | 6/2005 | Park .................. H01L 21/76895 |
| | | | 257/E21.59 |
| 2008/0079169 | A1 | 4/2008 | Maekawa |
| 2009/0152677 | A1 | 6/2009 | Horikawa |
| 2010/0221889 | A1 | 9/2010 | Youn |
| 2014/0264923 | A1 | 9/2014 | Chen et al. |
| 2016/0093635 | A1 | 3/2016 | Rabkin et al. |
| 2016/0240476 | A1 | 8/2016 | Takahashi et al. |
| 2019/0157280 | A1 | 5/2019 | Wang et al. |
| 2019/0164781 | A1 | 5/2019 | Tien et al. |
| 2020/0083162 | A1 | 3/2020 | Yang |
| 2020/0126999 | A1 | 4/2020 | Wang et al. |
| 2020/0212041 | A1 | 7/2020 | Machkaoutsan |
| 2020/0373171 | A1 | 11/2020 | Tien et al. |
| 2021/0167010 | A1 | 6/2021 | Yang |
| 2021/0193189 | A1 * | 6/2021 | Ahmed ............. H01L 21/76883 |
| 2021/0280434 | A1 | 9/2021 | Tien et al. |
| 2022/0208994 | A1 * | 6/2022 | Bai .................. H01L 29/66734 |

OTHER PUBLICATIONS

European Patent office action in application No. 21950753, mailed on Sep. 4, 2025.

* cited by examiner

METHOD FOR MANUFACTURING CONDUCTIVE PILLAR STRUCTURE FOR SEMICONDUCTOR SUBSTRATE AND CONDUCTIVE PILLAR STRUCTURE FOR SEMICONDUCTOR SUBSTRATE

CROSS-REFERENCE TO RELATED APPLICATIONS

This is a continuation of International Patent Application No. PCT/CN2021/124053 filed on Oct. 15, 2021, which claims priority to Chinese Patent Application No. 202110815094.8 filed on Jul. 19, 2021. The disclosures of the above applications are hereby incorporated by reference in their entirety.

BACKGROUND

With the development of semiconductor technology, the process nodes of the semiconductor structure continue to shrink, and thus the integration of the semiconductor structure become higher and higher. The increase in integration mainly brings the following benefits. First, the functions of semiconductor structure can be increased. Second, according to Moore's Law, the increase in integration will directly result in cost reduction. Third, the overall power supply voltage of the semiconductor structure can be reduced, thereby reducing power consumption.

In pursuit of smaller process nodes, the manufacturing process and the performance of the semiconductor structure need to be further improved.

SUMMARY

Embodiments of the disclosure relate to, but are not limited to, a method for manufacturing a semiconductor structure and a semiconductor structure.

An embodiment of the disclosure provides a method for manufacturing a semiconductor structure, the semiconductor structure including an array area, a peripheral area and a core area. The method for manufacturing the semiconductor structure includes the following operations. A base and a dielectric layer arranged on the base are provided. A first conductive pillar, a second conductive pillar and a third conductive pillar arranged in the dielectric layer are formed, in which the first conductive pillar is arranged in the array area, the second conductive pillar is arranged in the peripheral area, and the third conductive pillar is arranged in the core area. A mask layer is formed, in which the mask layer covers the dielectric layer, the first conductive pillar, the second conductive pillar and a portion of the third conductive pillar, and exposes a top surface of a portion of the third conductive pillar. A portion of a thickness of the third conductive pillar is etched by using the mask layer as a mask to form a third lower conductive pillar and a third upper conductive pillar stacked on one another, in which an area of a top surface of the third lower conductive pillar is greater than an area of a top surface of the third upper conductive pillar, and in which the third upper conductive pillar, the third lower conductive pillar and the dielectric layer are configured to form at least one groove. A cover layer filling the at least one groove is formed, in which the cover layer exposes the top surface of the third upper conductive pillar.

An embodiment of the disclosure further provides a semiconductor structure. The semiconductor structure includes an array area, a peripheral area and a core area, and further includes: a base, in which a dielectric layer is arranged on the base; a first conductive pillar, a second conductive pillar, and a third conductive pillar arranged in the dielectric layer, in which the first conductive pillar is arranged in an array area, the second conductive pillar is arranged in a peripheral area, and the third conductive pillar is arranged in a core area, and in which the third conductive pillar includes a third lower conductive pillar and a third upper conductive pillar stacked on one another, and an area of a top surface of the third lower conductive pillar is greater than an area of a top surface of the third upper conductive pillar; and a cover layer arranged in a region formed by the third upper conductive pillar, the third lower conductive pillar, and the dielectric layer.

BRIEF DESCRIPTION OF THE DRAWINGS

One or more embodiments are exemplarity explained through the figures in accompanying drawings corresponding thereto, these exemplary explanations do not constitute a limitation to the embodiments, elements having same reference numerals in the accompanying drawings are denoted as similar elements; and unless otherwise specifically declared, the figures in the accompanying drawings do not constitute a limitation of proportion.

DETAILED DESCRIPTION

A semiconductor structure usually includes an array area, a peripheral area and a core area. The core area is closely connected to the array area. The core area is provided with unique device structures, such as a word-line driver, and the peripheral area is configured to ensure that the functions of the core area can be implemented. When the dimension of the semiconductor structure is reduced, the dimensions of these three areas have to be continuously reduced, which results in high resistance of a conductive pillar in the core area. Therefore, the electrical performance of the core area cannot be effectively improved.

An embodiment of the disclosure provides a method for manufacturing a semiconductor structure, which includes the following operations. A mask layer is formed, in which the mask layer covers a first conductive pillar, a second conductive pillar and a portion of a third conductive pillar. A portion of a thickness of the third conductive pillar is etched to form a third lower conductive pillar and a third upper conductive pillar. In this way, the original profiles of the first conductive pillar and the second conductive pillar can be maintained, while changing the profile and dimension of the third conductive pillar. That is, the manufacturing process of these three areas is taken into consideration. The area of the top surface of the third lower conductive pillar is greater than the area of the top surface of the third upper conductive pillar, and the third upper conductive pillar, the third lower conductive pillar and the dielectric layer are configured to form a groove. A cover layer filling the groove is formed. The relatively large dimension of the third lower conductive pillar can reduce the resistance, thereby improving the electrical performance. The cover layer exposes the third upper conductive pillar with a relatively small dimension, so that erroneous electrical connection between the third upper conductive pillar and other conductive structures can be avoided.

Hereinafter, the respective embodiments of the disclosure will be described in detail in connection with the accompanying drawings. However, those of ordinary skill in the art may understand that, in the respective embodiments of the disclosure, numerous technical details are set forth in order to provide a reader with a better understanding of the disclosure. However, the technical solutions claimed in the disclosure can also be implemented without these technical details and various changes and modifications based on the respective embodiments below.

The embodiments of the disclosure provide a method for manufacturing a semiconductor structure. FIG. 1 to FIG. 12 are schematic diagrams corresponding to each operation in the method for manufacturing the semiconductor structure according to the embodiments, which will be described in detail below with reference to the accompanying drawings.

Figure 1:
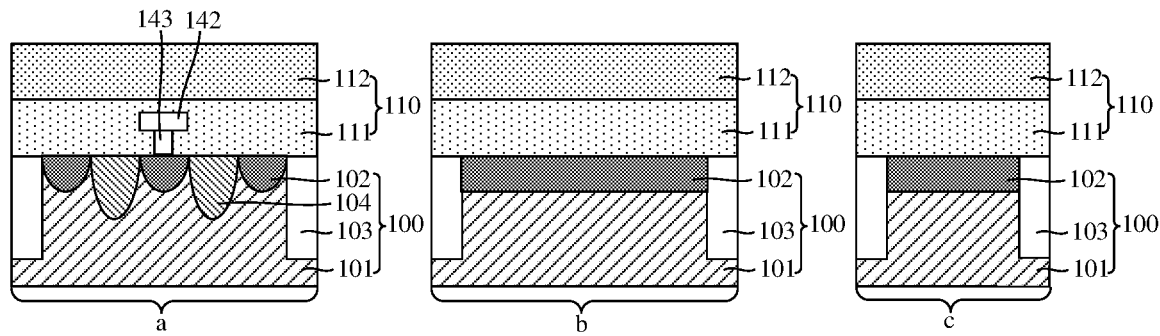
FIG. 1 is a first schematic diagram corresponding to an operation in a method for manufacturing a semiconductor structure according to an embodiment of the disclosure.

With reference to FIG. 1, the semiconductor structure includes an array area a, a peripheral area b, and a core area c. In an embodiment of the disclosure, the semiconductor structure may be a Dynamic Random Access Memory (DRAM). The array area a is configured to form a transistor, a word line, a bit line and the like. The core area c is configured to form a device structure, such as a word-line driver. The peripheral area b is configured to ensure that the functions of the core area c can be implemented.

A base 100 and a dielectric layer 110 arranged on the base 100 are provided. In some embodiments, the base 100 of each of the array area a, the peripheral area b, and the core area c is provided with a substrate 101, an isolation structure 103 and an active area 102. The material of the substrate 101 may be a semiconductor material, such as an elemental semiconductor material or a crystalline inorganic compound semiconductor material. The elemental semiconductor material may be silicon or germanium. The crystalline inorganic compound semiconductor material may be silicon germanium, gallium arsenide, or indium gallium, etc. The substrate 101 may further contain dopant ions, such as boron or phosphorus. The material of the isolation structures 103 is an insulating material, such as silicon oxide, silicon nitride, or silicon oxynitride, etc. The material of the active area 102 is a semiconductor material, and the active area 102 further contains dopant ions. In some embodiments, the doping type of the active area 102 may also be opposite to the doping type of the substrate 101.

Further, in an embodiment of the disclosure, the base 100 in the core area c is further provided with a gate (not shown), and the base 100 of the array area a is further provided with a word line 104. The material of the gate and the material of the word line 104 may be the same, which may be, for example, tungsten. In some embodiments, the material of the gate and the material of the word line may also be different from each other.

In some embodiments, a plurality of conductive pillars may be subsequently formed in the dielectric layer 110. The dielectric layer 110 may isolate the plurality of conductive pillars. In an embodiment of the disclosure, the dielectric layer 110 is a bilayer structure including a lower dielectric layer 111 and an upper dielectric layer 112 stacked on one another. In other embodiments, the dielectric layer may also be a single-layer structure, or a structure of three or more layers. The material of the dielectric layer 110 is an insulating material. For example, the material of the dielectric layer may be silicon oxide, silicon nitride, or silicon oxynitride, etc.

In an embodiment of the disclosure, the dielectric layer 110 of the array area a is further provided with a bit line contact layer 143 and a bit line conductive layer 142.

Figure 2:
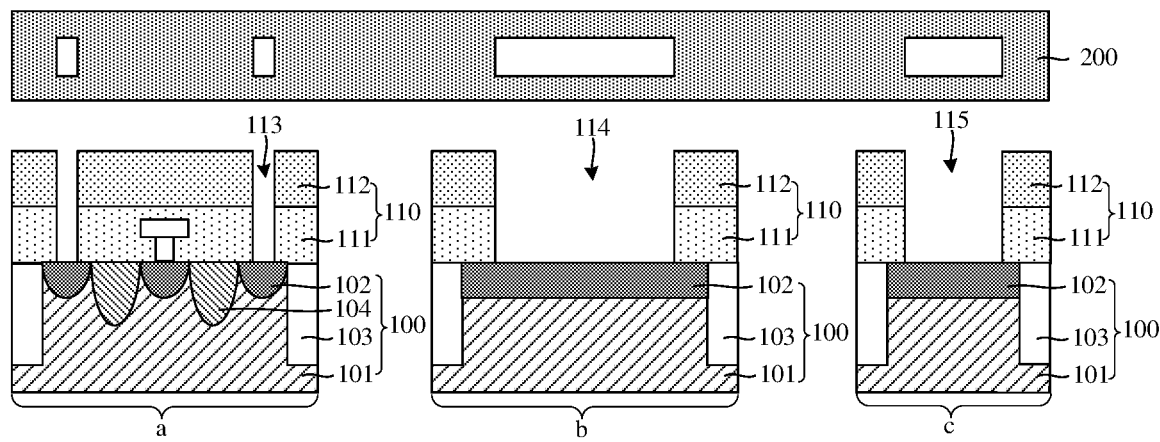
FIG. 2 is a second schematic diagram corresponding to an operation in a method for manufacturing a semiconductor structure according to an embodiment of the disclosure.
Figure 3:
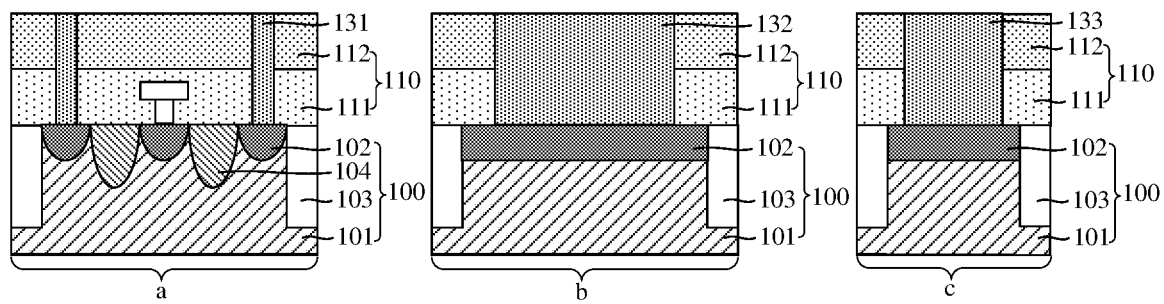
FIG. 3 is a third schematic diagram corresponding to an operation in a method for manufacturing a semiconductor structure according to an embodiment of the disclosure.

With reference to FIG. 2 and FIG. 3, a first conductive pillar 131, a second conductive pillar 132, and a third conductive pillar 133 arranged in the dielectric layer 110 are formed. The first conductive pillar 131 is arranged in the array area a, the second conductive pillar 132 is arranged in the peripheral area b, and the third conductive pillar 133 is arranged in the core area c.

The first conductive pillar 131 is electrically connected to the active area 102 in the array area a, the second conductive pillar 132 is electrically connected to the active area 102 in the peripheral area b, and the third conductive pillar 133 is electrically connected to the active area 102 and the gate in the core area c.

In some embodiments, with reference to FIG. 2, the dielectric layer 110 is etched by using a mask 200, so as to form a first through hole 113, a second through hole 114, and a third through hole 115 in the dielectric layer 110. The first through hole 113 is arranged in the array area a, the second through hole 114 is arranged in the peripheral area b, and the third through hole 115 is arranged in the core area c. That is, the first through hole 113, the second through hole 114, and the third through hole 115 are formed in the same operation, so that the production process can be simplified.

The first through hole 113 is configured to be subsequently filled with the first conductive pillar, the second through hole 114 is configured to be subsequently filled with the second conductive pillar, and the third through hole 115 is configured to be subsequently filled with the third conductive pillar.

With reference to FIG. 3, the first conductive pillar 131 filling the first through hole 113 (with reference to FIG. 2), the second conductive pillar 132 filling the second through hole 114 (with reference to FIG. 2), and the third conductive pillar 133 filling the third through hole 115 (with reference to FIG. 2) are formed.

In an embodiment of the disclosure, the first conductive pillar 131, the second conductive pillar 132, and the third conductive pillar 133 are formed in the same operation, so that the production process can be simplified. In some embodiments, the first conductive pillar 131, the second conductive pillar 132, and the third conductive pillar 133 may be formed through a physical vapor deposition process, or may be formed through a chemical vapor deposition process.

In an embodiment of the disclosure, the materials of the first conductive pillar 131, the second conductive pillar 132, and the third conductive pillar 133 may be the same and are an conductive material, such as tungsten, copper, gold, silver, or polycrystalline silicon, etc. In some embodiments, the materials of the first conductive pillar, the second conductive pillar, and the third conductive pillar may also be different from each other.

In an embodiment of the disclosure, the first conductive pillar 131, the second conductive pillar 132, and the third conductive pillar 133 may be formed in the shape of a cuboid. The first conductive pillar, the second conductive pillar, and the third conductive pillar may also be formed in the shape of a cylinder.

Figure 4:
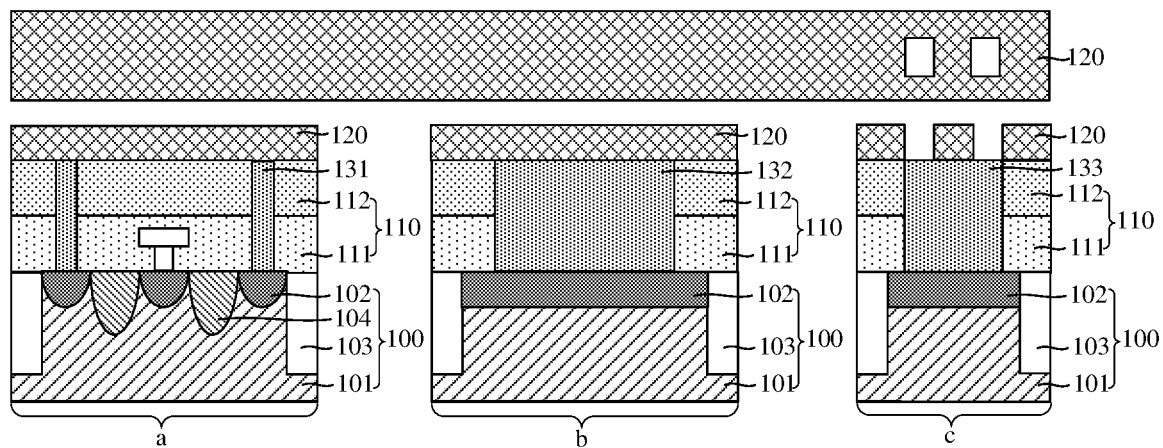
FIG. 4 is a fourth schematic diagram corresponding to an operation in a method for manufacturing a semiconductor structure according to an embodiment of the disclosure.

With reference to FIG. 4, a mask layer 120 is formed. The mask layer 120 covers the dielectric layer 110, the first conductive pillar 131, the second conductive pillar 132, and a portion of the third conductive pillar 133. The mask layer 120 also exposes a top surface of a portion of the third conductive pillar 133. In this embodiment, the material of the mask layer 120 is a photoresist. In other embodiments, the material of the mask layer may also be a hard mask material, such as silicon nitride, silicon oxide, or silicon oxynitride, etc.

Figure 5:
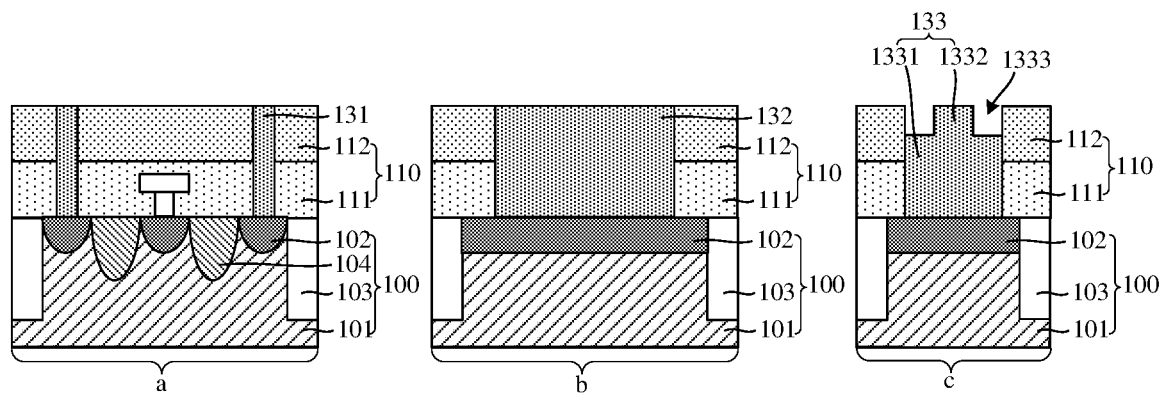
FIG. 5 is a fifth schematic diagram corresponding to an operation in a method for manufacturing a semiconductor structure according to an embodiment of the disclosure.

With reference to FIG. 5, a portion of a thickness of the third conductive pillar 133 is etched by using the mask layer 120 (with reference to FIG. 4) as a mask, so as to form a third lower conductive pillar 1331 and a third upper conductive pillar 1332 stacked on one another. An area of a top surface of the third lower conductive pillar 1331 is greater than an area of a top surface of the third upper conductive pillar 1332, and the third upper conductive pillar 1332, the third lower conductive pillar 1331 and the dielectric layer 110 form a groove 1333.

The third conductive pillar 133 is etched, so that the dimension and the profile of the third conductive pillar 133 are changed without changing the dimensions and the profiles of the first conductive pillar 131 and the second conductive pillar 132 covered by the mask layer 120.

Subsequently, a cover layer filling the groove 1333 may be formed. The cover layer exposes the top surface of the third upper conductive pillar 1332. The third upper conductive pillar 1332 will be electrically connected to a corresponding conductive structure. It should be understood that, if the third upper conductive pillar 1332 also has a relatively large dimension, the third upper conductive pillar 1332 may be electrically connected to other conductive structures, to which the third upper conductive pillar should not be electrically connected, thereby causing a short circuit. Therefore, the third upper conductive pillar 1332 and the third lower conductive pillar 1331 provided in this embodiment can reduce the resistance, while avoiding erroneous electrical connection.

A ratio of an etching depth of the groove 1333 to the thickness of the third conductive pillar 133 is greater than ⅕, for example, the ratio may be ⅖, ½, ⅗. It should be understood that, the etching depth may affect the process time, may also affect the resistance and firmness of the third conductive pillar 133, and may also affect the density of the cover layer subsequently filled. When the ratio of the etching depth of the groove 1333 to the thickness of the third conductive pillar 133 falls within the above range, the process time is relatively short, so that the third conductive pillar 133 can maintain a lower resistance and greater firmness. Meanwhile, the cover layer subsequently filled in the groove 1333 may have a greater density, so that the cover layer may have a good isolation effect.

A ratio of the area of the top surface of the third upper conductive pillar 1332 to the area of the top surface of the third lower conductive pillar 1331 is smaller than ⅘, for example, the ratio may be ½, ⅓ or ¼. When the ratio falls within the above range, the probability of erroneous electrical connection of the third upper conductive pillar 1332 can be reduced, and the resistance of the third lower conductive pillar 1331 can be further reduced.

The relative position of the groove 1333, the third upper conductive pillar 1332, and the third lower conductive pillar 1331 will be described in detail below.

In an embodiment of the disclosure, one third upper conductive pillar 1332 is configured to form one groove 1333.

Figure 6:
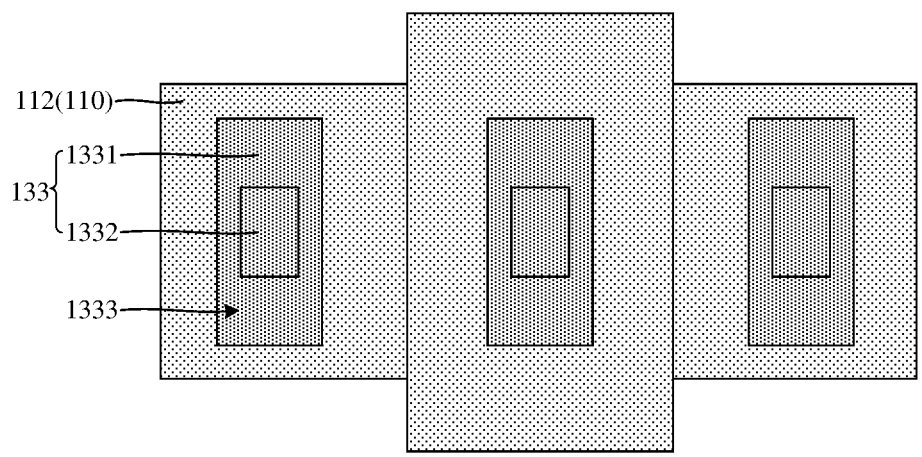
FIG. 6 is a sixth schematic diagram corresponding to an operation in a method for manufacturing a semiconductor structure according to an embodiment of the disclosure.

In an example, with reference to FIG. 5 and FIG. 6, FIG. 6 is a top view of a core area c shown in FIG. 5. It should be noted that, the left side region or right side region in FIG. 6 corresponds to the core area c shown in FIG. 5. The middle region in FIG. 6 is not shown in FIG. 5. The third lower conductive pillar 1331 in the middle region is electrically connected to the gate in the base 100 in the core area c. All sidewalls of one third upper conductive pillar 1332 are configured to form one groove 1333, and the groove 1333 surrounds the third upper conductive pillar 1332. That is, all the sidewalls of the third upper conductive pillar 1332, the top surface of the third lower conductive pillar 1331, and the dielectric layer 110 form one groove 1333.

In this case, a length of the third lower conductive pillar 1331 is greater than a length of the third upper conductive pillar 1332, and a width of the third lower conductive pillar 1331 is greater than a width of the third upper conductive pillar 1332. That is, the area of the top surface of the third lower conductive pillar 1331 for forming the groove 1333 can be maximized, so that the resistance of the third lower conductive pillar 1331 can be further reduced.

In some embodiments, a central axis of the third upper conductive pillar 1332 in a direction perpendicular to the top surface of the base 100 coincides with a central axis of the third lower conductive pillar 1331 in the direction perpendicular to the top surface of the base 100. In other embodiments, the central axis of the third upper conductive pillar may also not coincide with the center axis of the third lower conductive pillar.

Figure 7:
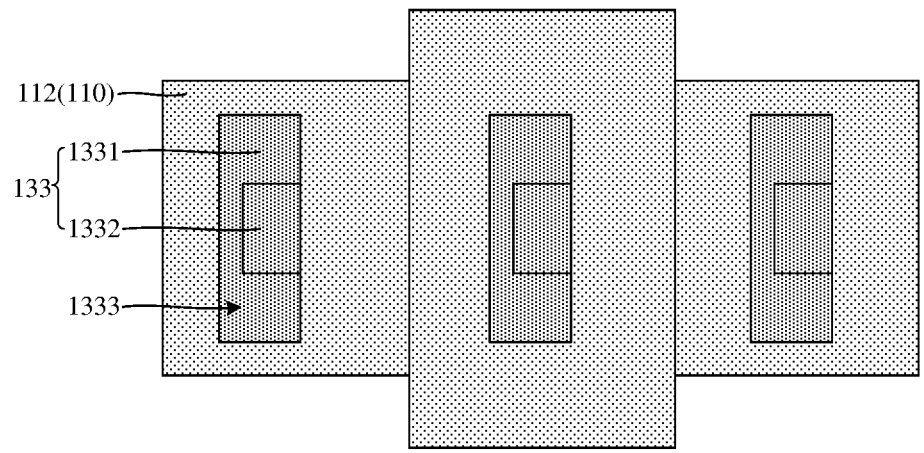
FIG. 7 is a seventh schematic diagram corresponding to an operation in a method for manufacturing a semiconductor structure according to an embodiment of the disclosure.

In some embodiments, with reference to FIG. 7, three sidewalls of the third upper conductive pillar 1332 are configured to form one groove 1333. That is, three sidewalls of the third upper conductive pillar 1332, the top surface of the third lower conductive pillar 1331, and the dielectric layer 110 form one groove 1333. That is, the groove 1333 surrounds only three sidewalls of the third upper conductive pillar 1332, and the other sidewall of the third upper conductive pillar 1332 is aligned with a respective sidewall of the third lower conductive pillar 1331.

Figure 8:
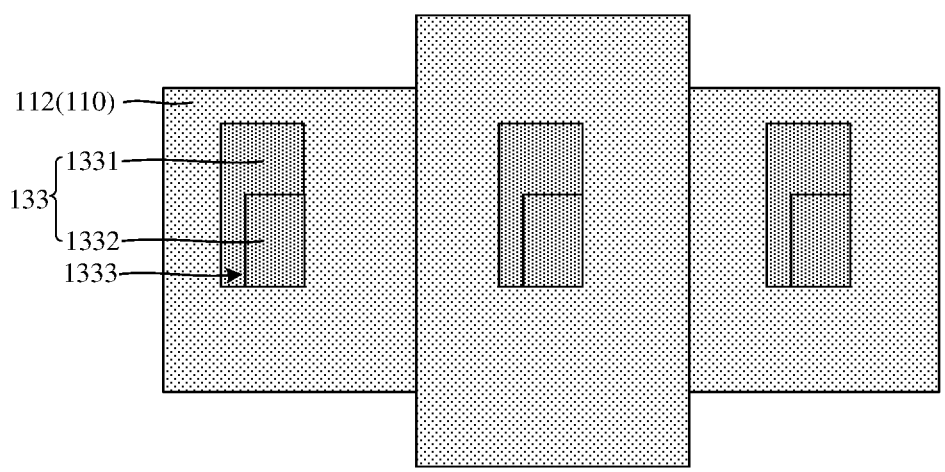
FIG. 8 is an eighth schematic diagram corresponding to an operation in a method for manufacturing a semiconductor structure according to an embodiment of the disclosure.

In some embodiments, with reference to FIG. 8, two connected sidewalls of the third upper conductive pillar 1332 are configured to form one groove 1333. That is, two connected sidewalls of the third upper conductive pillar 1332, the top surface of the third lower conductive pillar

1331, and the dielectric layer 110 form one groove 1333. In some embodiments, the other two connected sidewalls of the third upper conductive pillar 1332 are aligned with two respective sidewalls of the third lower conductive pillar 1331.

Figure 9:
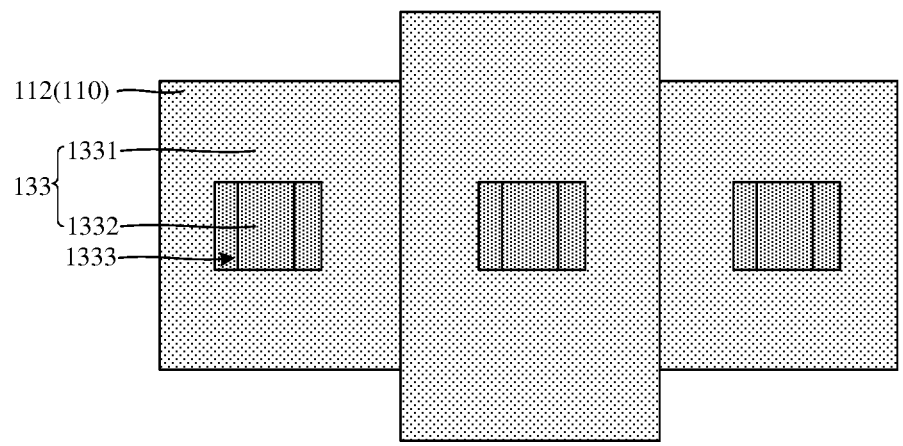
FIG. 9 is a ninth schematic diagram corresponding to an operation in a method for manufacturing a semiconductor structure according to an embodiment of the disclosure.

In some embodiments, with reference to FIG. 9, one sidewall of the third upper conductive pillar 1332 is configured to form one groove 1333. That is, one sidewall of the third upper conductive pillar 1332, the top surface of the third lower conductive pillar 1331, and the dielectric layer 110 form one groove 1333. In some embodiments, three other sidewalls of the third upper conductive pillar 1332 are aligned with three respective sidewalls of the third lower conductive pillar 1331.

Figure 10:
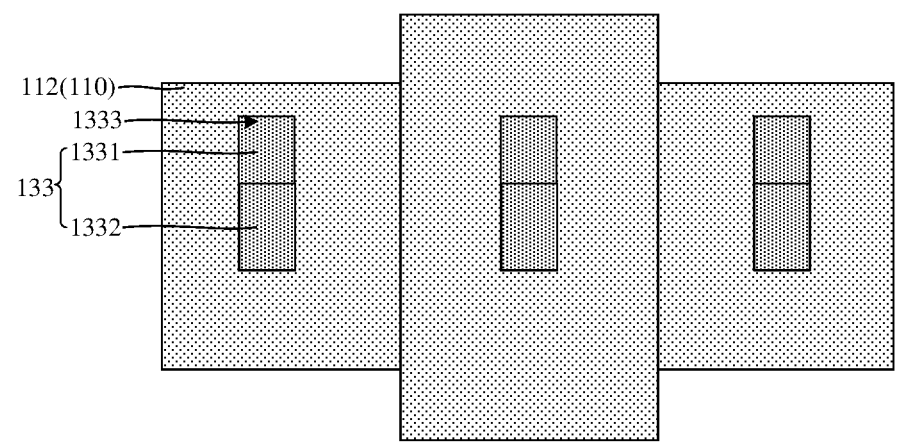
FIG. 10 is a tenth schematic diagram corresponding to an operation in a method for manufacturing a semiconductor structure according to an embodiment of the disclosure.

In some embodiments, with reference to FIG. 10, one third upper conductive pillar 1332 is configured to form two grooves 1333, and two opposite sidewalls of the third upper conductive pillar 1332 are respectively configured to form the two grooves 1333. That is, two opposite sidewalls of the third upper conductive pillar 1332, the top surface of the third lower conductive pillar 1331, and the dielectric layer 110 form two grooves 1333.

In some embodiments, the central axis of the third upper conductive pillar 1332 in the direction perpendicular to the top surface of the base 100 may further coincide with the central axis of the third lower conductive pillar 1331 in the direction perpendicular to the top surface of the base 100.

Figure 11:
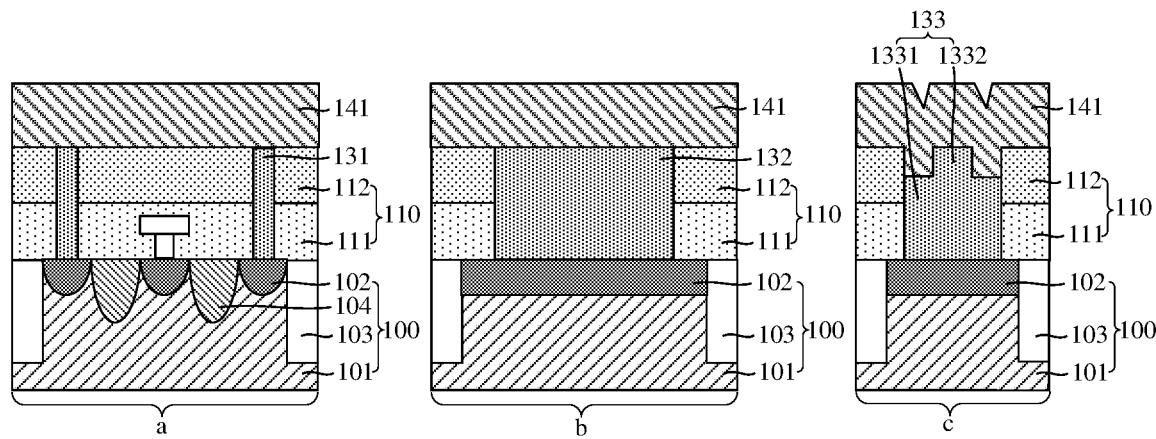
FIG. 11 is an eleventh schematic diagram corresponding to an operation in a method for manufacturing a semiconductor structure according to an embodiment of the disclosure.
Figure 12:
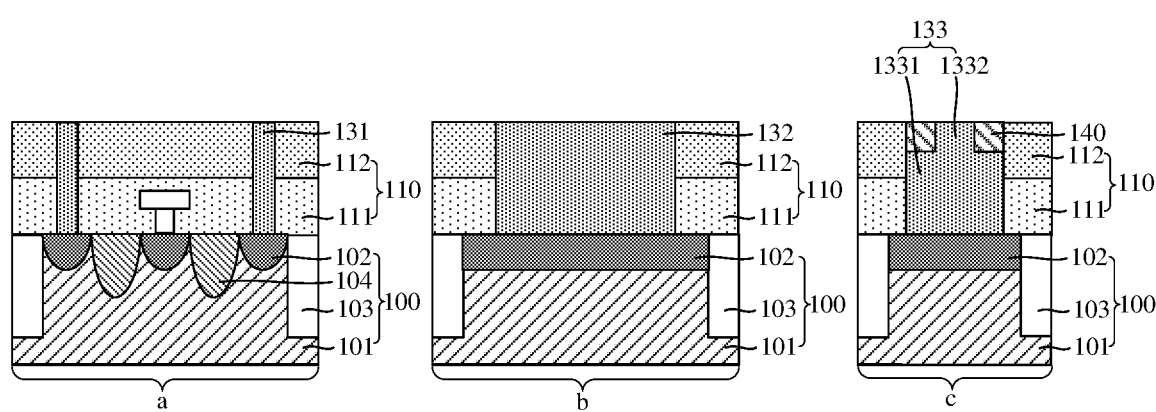
FIG. 12 is a twelfth schematic diagram corresponding to an operation in a method for manufacturing a semiconductor structure according to an embodiment of the disclosure.

With reference to FIG. 11 and FIG. 12, a cover layer 140 filling the groove 1333 is formed. The cover layer 140 exposes the top surface of the third upper conductive pillar 1332.

In some embodiments, with reference to FIG. 11, an initial cover layer 141 covering the dielectric layer 110, the first conductive pillar 131, the second conductive pillar 132, the third upper conductive pillar 1332 and the third lower conductive pillar 1331 is formed. In an embodiment of the disclosure, the initial cover layer 141 may be formed through a chemical vapor deposition process, and the initial cover layer 141 is made of an insulating material. In some embodiments, the material of the initial cover layer 141 may be the same as the material of the upper dielectric layer 112. For example, both may be silicon nitride. The material of the initial cover layer 141 may also be different from the material of the upper dielectric layer 112.

With reference to FIG. 12, a portion of the initial cover layer 141 is removed to expose the top surface of the first conductive pillar 131, the top surface of the second conductive pillar 132, and the top surface of the third upper conductive pillar 1332, and the remaining portion of the initial cover layer 141 forms the cover layer. In some embodiments, planarization is performed on the initial cover layer 141, so as to remove the initial cover layer 141 higher than the top surface of the dielectric layer 110. In some embodiments, planarization may be performed on the initial cover layer by chemical mechanical polishing. A portion of the initial cover layer may also be removed through an etching process.

In an embodiment of the disclosure, the third upper conductive pillar 1332 and the third lower conductive pillar 1331 are formed. The area of the top surface of the third upper conductive pillar 1332 is less than the area of the top surface of the third lower conductive pillar 1331, so that the probability of short circuit between the third upper conductive pillar 1332 and other conductive structures can be reduced, and the resistance of the third conductive pillar 133 can also be reduced, thereby improving the electrical performance of the third conductive pillar 133. Further, while forming the third conductive pillar 133, the formation processes of the array area a and the peripheral area b are taken into consideration, thereby optimizing the manufacturing process of the semiconductor structure.

An embodiment of the disclosure provides a semiconductor structure, which may be manufactured by the method for manufacturing the semiconductor structure provided in the above embodiments. FIG. 12 is a schematic diagram of a semiconductor structure according to an embodiment. With reference to FIG. 12, the semiconductor structure includes: a base 100, in which a dielectric layer 110 is arranged on the base 100; a first conductive pillar 131, a second conductive pillar 132, and a third conductive pillar 133 arranged in the dielectric layer 110, in which the first conductive pillar 131 is arranged in the array area a, the second conductive pillar 132 is arranged in the peripheral area b, and the third conductive pillar 133 is arranged in the core area c, the third conductive pillar 133 includes a third lower conductive pillar 1331 and a third upper conductive pillar 1332 stacked on one another, and an area of a top surface of the third lower conductive pillar 1331 is greater than an area of a top surface of the third upper conductive pillar 1332; and a cover layer 140, in which the cover layer 140 is arranged in a region formed by the third upper conductive pillar 1332, the third lower conductive pillar 1331 and the dielectric layer 110. The parts of this embodiment that are the same as or similar to the above embodiments are described in detailed with reference to the above embodiments, which are not repeated herein.

Hereinafter, it will be described with reference to the accompanying drawings.

In an embodiment of the disclosure, the base of each of the array area a, the peripheral area b, and the core area c is provided with a substrate 101, an isolation structure 103, and an active area 102. The base 100 in the core area c is further provided with a gate, and the base 100 of the array area a is further provided with a word line 104.

The first conductive pillar 131 is electrically connected to the active area 102. The second conductive pillar 132 is electrically connected to the active area 102. The third conductive pillar 133 is electrically connected to the gate or the active area 102.

The third conductive pillar 133 includes a third lower conductive pillar 1331 and a third upper conductive pillar 1332 stacked on one another. In an embodiment of the disclosure, the third upper conductive pillar 1332 and the third lower conductive pillar 1331 may be formed in the shape of a cuboid. That is, the cross-sectional shapes of the third upper conductive pillar 1332 and the third lower conductive pillar 1331 are rectangular in a direction parallel to the top surface of the base 100. The third upper conductive pillar 1332 and the third lower conductive pillar 1331 may also be formed in the shape of a cylinder.

In an embodiment of the disclosure, an orthographic projection of the top surface of the third upper conductive pillar 1332 on the top surface of the third lower conductive pillar 1331 falls within the top surface of the third lower conductive pillar 1331. In this case, the third upper conductive pillar 1332 is aligned with the third lower conductive pillar 1331, and the contact surface between the third upper conductive pillar and the third lower conductive pillar has the largest area, and the contact resistance is minimized.

A ratio of a thickness of the third upper conductive pillar 1332 to a thickness of the third lower conductive pillar 1331 ranges from ⅗ to ⅔. For example, the ratio may be ½. When the thickness ratio falls within the above range, the third lower conductive pillar 1331 may have a relatively large volume, so that the third lower conductive pillar 1331 has relatively small resistance.

In an embodiment of the disclosure, the cover layer 140 surrounds the third upper conductive pillar 1332, and the cover layer 140 is an enclosed annular structure. When the cover layer 140 is an enclosed annular structure, the cover layer 140 has a relatively large volume. Since the cover layer 140 is arranged directly above the third lower conductive pillar 1331, the third lower conductive pillar 1331 may also have a relatively large volume accordingly, thereby facilitating reducing the resistance of the third lower conductive pillar 1331. When the cover layer 140 surrounds the third upper conductive pillar 1332, the sidewalls of the third upper conductive pillar 1332 are not aligned with the sidewalls of the third lower conductive pillar 1331. In other embodiments, a part of sidewalls of the third upper conductive pillar may also be aligned with a part of sidewalls of the third lower conductive pillar.

In some embodiments, with reference to FIG. 7, one sidewall of the third upper conductive pillar 1332 is aligned with one respective sidewall of the third lower conductive pillar 1331. With reference to FIG. 8 and FIG. 9, two sidewalls of the third upper conductive pillar 1332 are respectively aligned with two respective sidewalls of the third lower conductive pillar 1331. With reference to FIG. 10, three sidewalls of the third upper conductive pillar 1332 are respectively aligned with three respective sidewalls of the third lower conductive pillar 1331. That is, the cover layer 140 (with reference to FIG. 12) surrounds only a part of sidewalls of the third upper conductive pillar 1332, and the remaining part of sidewalls of the third upper conductive pillar 1332 which are not surrounded by the cover layer 140 is aligned with a part of sidewalls of the third lower conductive pillar 1331.

In some embodiments, the area of the top surface of the third upper conductive pillar 1332 is less than the area of the top surface of the third lower conductive pillar 1331, so that the probability of short circuit between the third upper conductive pillar 1332 and other conductive structures can be reduced, and the resistance of the third conductive pillar 133 can also be reduced, thereby improving the electrical performance of the third conductive pillar 133.

Those of ordinary skill in the art may understand that the above embodiments are some embodiments of the disclosure. In practical applications, various changes may be made in forms and detail without departing from the spirit and scope of the disclosure. Any person skilled in the art may make changes and modifications without departing from the spirit and scope of the disclosure. Therefore, the protection scope of disclosure should be subjected to the scope defined by the appended claims.

What is claimed is:

1. A method for manufacturing a semiconductor structure having an array area, a peripheral area and a core area, the method for manufacturing the semiconductor structure comprising:
providing a base and a dielectric layer arranged on the base;
forming a first conductive pillar, a second conductive pillar and a third conductive pillar arranged in the dielectric layer, wherein the first conductive pillar is arranged in the array area, the second conductive pillar is arranged in the peripheral area, and the third conductive pillar is arranged in the core area;
forming a mask layer, wherein the mask layer covers the dielectric layer, the first conductive pillar, the second conductive pillar and a portion of the third conductive pillar, and exposes a top surface of a portion of the third conductive pillar;
etching a portion of a thickness of the third conductive pillar by using the mask layer as a mask to form a third lower conductive pillar and a third upper conductive pillar stacked on one another, wherein an area of a top surface of the third lower conductive pillar is greater than an area of a top surface of the third upper conductive pillar, and wherein the third upper conductive pillar, the third lower conductive pillar and the dielectric layer are configured to form at least one groove; and
forming a cover layer filling the at least one groove, wherein the cover layer exposes the top surface of the third upper conductive pillar;
wherein before the forming the first conductive pillar, the second conductive pillar and the third conductive pillar, using a mask to etch the dielectric layer to form a first through hole, a second through hole, and a third through hole, the first through hole is arranged in the array area, the second through hole is arranged in the peripheral area, and the third through hole is arranged in the core area, the first through hole, the second through hole, and the third through hole are formed in the same operation;
filling the first through hole, the second through hole, and the third through hole to forming the first conductive pillar, the second conductive pillar and the third conductive pillar respectively.

2. The method for manufacturing the semiconductor structure of claim 1, wherein the third upper conductive pillar is configured to form one groove.

3. The method for manufacturing the semiconductor structure of claim 2, wherein all sidewalls of the third upper conductive pillar are configured to form the groove, and the groove surrounds the third upper conductive pillar.

4. The method for manufacturing the semiconductor structure of claim 2, wherein three sidewalls of the third upper conductive pillar are configured to form the groove, or two connected sidewalls of the third upper conductive pillar are configured to form the groove, or one sidewall of the third upper conductive pillar is configured to form the groove.

5. The method for manufacturing the semiconductor structure of claim 1, wherein the third upper conductive pillar is configured to form two grooves, and two respective opposite sidewalls of the third upper conductive pillar are respectively configured to form the two grooves.

6. The method for manufacturing the semiconductor structure of claim 1, wherein a ratio of the area of the top surface of the third upper conductive pillar to the area of the top surface of the third lower conductive pillar is less than 4/5.

7. The method for manufacturing the semiconductor structure of claim 1, wherein a ratio of an etching depth of the at least one groove to the thickness of the third conductive pillar is greater than 1/5.

8. The method for manufacturing the semiconductor structure of claim 1, wherein the base is provided with a plurality of active areas, and the plurality of active areas are electrically connected to the first conductive pillar, the second conductive pillar and the third conductive pillar.

9. The method for manufacturing the semiconductor structure of claim 1, wherein forming the cover layer comprises: forming an initial cover layer covering the dielectric layer, the first conductive pillar, the second conductive pillar, the third upper conductive pillar, and the third lower conductive pillar, and removing a portion of the initial cover layer to expose a top surface of the first conductive pillar, a top surface of the second conductive pillar and the top surface of the third upper conductive pillar, wherein a remaining portion of the initial cover layer forms the cover layer.

\* \* \* \* \*